United States Patent [19]
Oh

[11] Patent Number: 5,844,258
[45] Date of Patent: Dec. 1, 1998

[54] EMITTER SWITCHED THYRISTOR

[75] Inventor: Kwang-Hoon Oh, Seoul, Rep. of Korea

[73] Assignee: Samsung Electronics Co., Ltd., Kyungki-Do, Rep. of Korea

[21] Appl. No.: 668,254

[22] Filed: Jun. 20, 1996

[30] Foreign Application Priority Data

Oct. 25, 1995 [KR]  Rep. of Korea .................. 1995 37098

[51] Int. Cl.⁶ ................................................. H01L 29/74
[52] U.S. Cl. .......................... 257/139; 257/152; 257/153
[58] Field of Search .................................... 257/139, 147, 257/153, 152

[56] References Cited

U.S. PATENT DOCUMENTS 5,296,725  3/1994  Nandakomar et al. .................. 257/139
5,355,003  10/1994  Tomomatsu ............................. 257/139

Primary Examiner—Tom Thomas
Assistant Examiner—David B. Hardy
Attorney, Agent, or Firm—Cushman Darby & Cushman IP Group of Pillsbury Madison & Sutro LLP

[57] ABSTRACT

An emitter switched thyristor has an enlarged safe operating range. A semiconductor substrate of a first conductivity type (a p-type) is provided and a semiconductor region of a second conductivity type (an n-type) is formed on the substrate. A well region of the first conductivity type is formed within the semiconductor region, and a plurality of well subregions of the second conductivity type are formed within the well region. The well subregions are all separated from each other by a separating portion of the well region. A plurality of electrode contacts are provided, including a gate electrode in contact with the well region and at least first and second cathode electrodes. The second cathode electrode is in contact with the separating portion of the well region.

27 Claims, 5 Drawing Sheets

EMITTER SWITCHED THYRISTOR

BACKGROUND OF THE INVENTION (1) Field of Invention

The present invention relates to an emitter switched thyristor (EST). More particularly, the present invention relates to an emitter switched thyristor conjoining a P-N-P-N or an N-P-N-P structure, that is, a MOS channel with a thyristor structure.

(2) Description of Related Art

Generally, the use of power semiconductors having a MOS gate structure is growing rapidly due to a rapid increase in demand for power semiconductor elements. Various power semiconductors are being developed including the power MOSFET having excellent switching properties, the IGBT which combines the merits of MOSFETs with the merits of BJTs (bipolar junction transistors), the MCT (MOS controlled thyristor) which extremely expands current capacity by using a PNPN thyristor structure, the EST (emitter switched thyristor) which combines a MOS channel with a thyristor structure, and others.

The development focus for power semiconductors is to minimize a conduction loss and a switching loss. MCTs and ESTs using a thyristor structure have a very low conduction loss, because they have a current capacity of several tens or hundreds times as much as MOSFETs or IGBTs by double injection mechanism.

Reference will now be made in detail to a conventional emitter switched thyristor, an example of which is illustrated in the accompanying drawings.

FIG. 1 is a sectional view illustrating a conventional emitter switched thyristor, FIGS. 2 to 4 are sectional views illustrating the operation of the emitter switched thyristor illustrated in FIG. 1, and FIG. 5 is an output characteristic illustrating the operation properties of the emitter switched thyristor illustrated in FIG. 1.

As illustrated in FIG. 1, the structure of a conventional emitter switched thyristor is as follows:

A high-concentration N type buffer layer 2 is formed on a high-concentration P type substrate 1, and a low-concentration N type epitaxial layer 3 is formed on the buffer layer 2. Then, a low density P type active well 4, and a high density P type active well 5, which is deeper than the former, are formed in N type epitaxial layer 3. A high density N type floating emitter area 6 is formed in a low density P type active well 4, and a main emitter area 7 which is separated from floating emitter area 6 is formed in a high density P type active well 5. Also, on a high density substrate 1, a turn-on insulated gate 8a is formed adjacent to part of N type epitaxial layer 3, low density P type active well 4 and part of high density N type floating emitter 6. A cathode electrode 9 is formed on main emitter 7 and part of high density p-type base 5. An anode electrode 10 is formed for an electrode, and, under a high density P type substrate 1. Here, part of the device including a floating emitter 6 and a low density P area 4, etc. is named a main thyristor A, and part of the device including a main emitter 7 and high density P area 5, etc. is named a parasitic thyristor B.

The operation of the illustrated conventional emitter switched thyristor will now be explained, referring to FIGS. 2–4 and the graph of FIG. 5.

FIG. 5 is a graph illustrating the current-voltage characteristics of the emitter switch thyristor (EST). The current I shown in FIG. 5 is the current entering anode 10, and the voltage V is the voltage applied between anode 10 and cathode 9. The areas "a" and "b" correspond to the safe operating range of the EST, before the parasitic thyristor B (including, among other elements, main emitter 7 and active well 5) is turned on. When this occurs, the EST current (i.e., the current entering anode 10) exceeds the latch current $I_L$ (which corresponds to the latch current of the parasitic thyristor B), and the current-voltage characteristics of the EST lie within the area "c" in the graph illustrated in FIG. 5.

When applying a positive bias voltage $V_{AC}$ across anode 10 and cathode 9, and applying a positive bias voltage $V_G$ to gate 8, an inversion layer is formed inside active well 4 just below gate 8. This inversion layer is electrically connected with main emitter 7 via emitter 6, and serves as a path for electron current. More specifically, electrons flow from cathode 9 to epitaxial layer 3 through this inversion layer, serving as the base current for a PNP transistor composed of substrate 1, buffer layer 2, epitaxial layer 3 and P type active well 5. As this base current flows through high density buffer layer 2 into high density 1, holes are injected into epitaxial layer 3 from substrate 1. As a result, the emitter switch thyristor is turned on and a MOS structure, composed of floating emitter 6, low density active well 4, turn-on insulated gate 8a and epitaxial layer 3, allows the emitter switched thyristor to be triggered.

At this time, the current-voltage characteristics of the EST fall within the area "a" in FIG. 5, and the illustrated conventional EST operates similar to an IGBT in this range. Generally, the current of the EST (flowing into anode 10) increases as the voltage applied between anode 10 and cathode 9 increases. If the bias voltage applied between anode 10 and cathode 9 is increased further, the current I entering anode 10 increases and the hole current flowing into low density active well 4 is increased. The current increases rapidly because main thyristor A (including, among other elements, floating emitter 6 and active well 4) is operated by forward biasing a PN junction formed between floating emitter 6 and low density active well 4. This forward bias is created by a voltage drop caused by the increased hole current. Accordingly, in the illustrated conventional EST, the current $I_A$ flowing into anode 10 may be controlled in accordance with an amount of current flowing through the main thyristor A (i.e., flowing into floating emitter 6). This, combined with the use of a gate channel structure (comprising, among other elements, an inversion layer electrically connecting main emitter 7 to floating emitter 6), facilitates easy switching of the illustrated conventional EST.

If the bias voltage applied between anode 10 and cathode 9 continues to increase, as shown in FIG. 4, the voltage drop caused by holes flowing into each of active wells 4 and 5 (which accompanies the increase in current $I_A$ entering anode 10) causes parasitic thyristor B to easily be turned on. When this occurs, the operation of the illustrated conventional EST is difficult to control. When gate 8 and cathode 9 are shorted, or when a negative bias voltage is applied to gate 8, the parasitic thyristor current flowing through main emitter 7 cannot be easily eliminated, and the overall illustrated conventional EST becomes difficult to operate. The current-voltage characteristics of the EST now correspond to area "c" in the graph of FIG. 5.

SUMMARY OF THE INVENTION

An object of the invention is to prevent turning on of a parasitic thyristor within an emitter switched thyristor (EST) and to enlarge the safe operating range of the EST. This is done by causing hole current to flow into the EST's cathode, before it reaches a main emitter. This limits the flow of current into a p-type active well located below the EST's main emitter.

The present invention, therefore, is directed to an emitter switch thyristor. A semiconductor substrate of a first conductivity type (e.g., p-type) is provided, and a semiconductor region of a second conductivity type (e.g. n-type) is formed on the substrate. A well region of the first conductivity type is formed within the semiconductor region. A plurality of well subregions of the second conductivity type are formed within the well region and separated by a separating portion of the well region. A plurality of electrode contacts are provided which comprise a gate electrode in contact with the well region and a cathode electrode in contact with one of the well subregions and further in contact with the separating portion of the well region which divides the plural well subregions.

BRIEF DESCRIPTION OF THE DRAWINGS

The present invention will now be described more specifically with reference to the attached drawings, wherein.

DETAILED DESCRIPTION OF THE PREFERRED EMBODIMENTS

A preferred embodiment of the present invention will become apparent from a study of the following detailed description, when viewed in light of the accompanying drawings.

Figure 7:
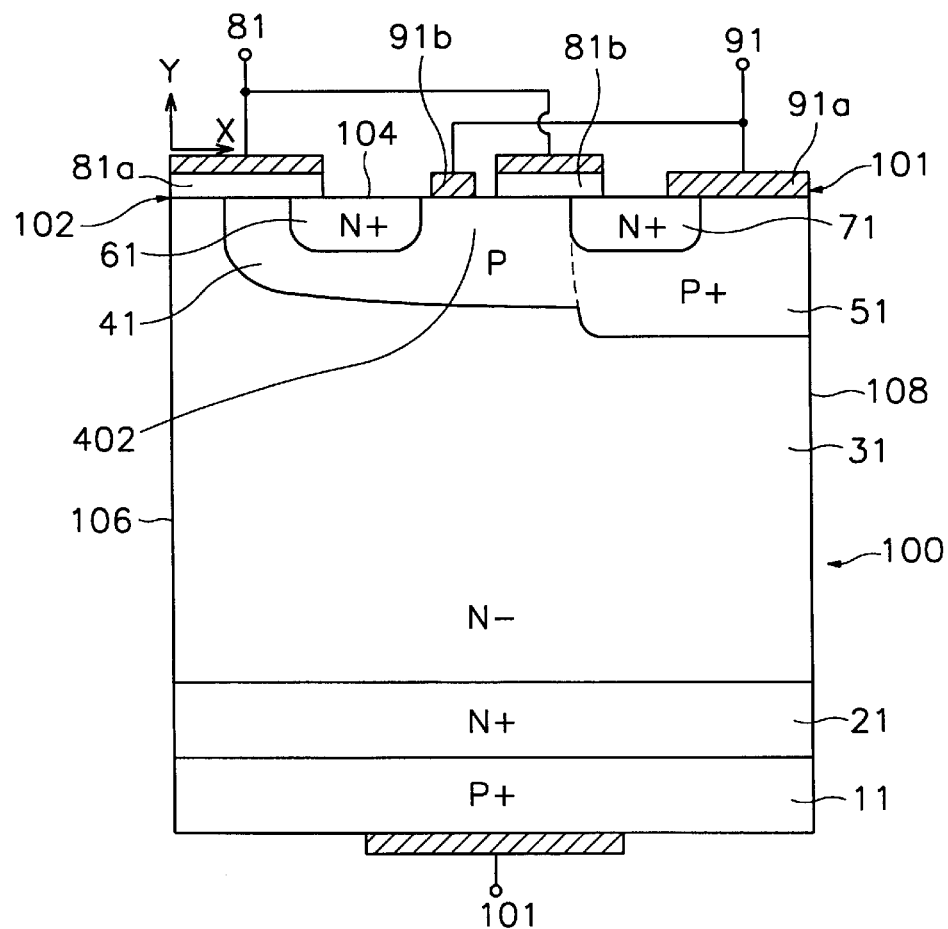
FIG. 7 is a sectional view of the EST illustrated in FIG. 6 taken along the line A–A'.
Figure 6:
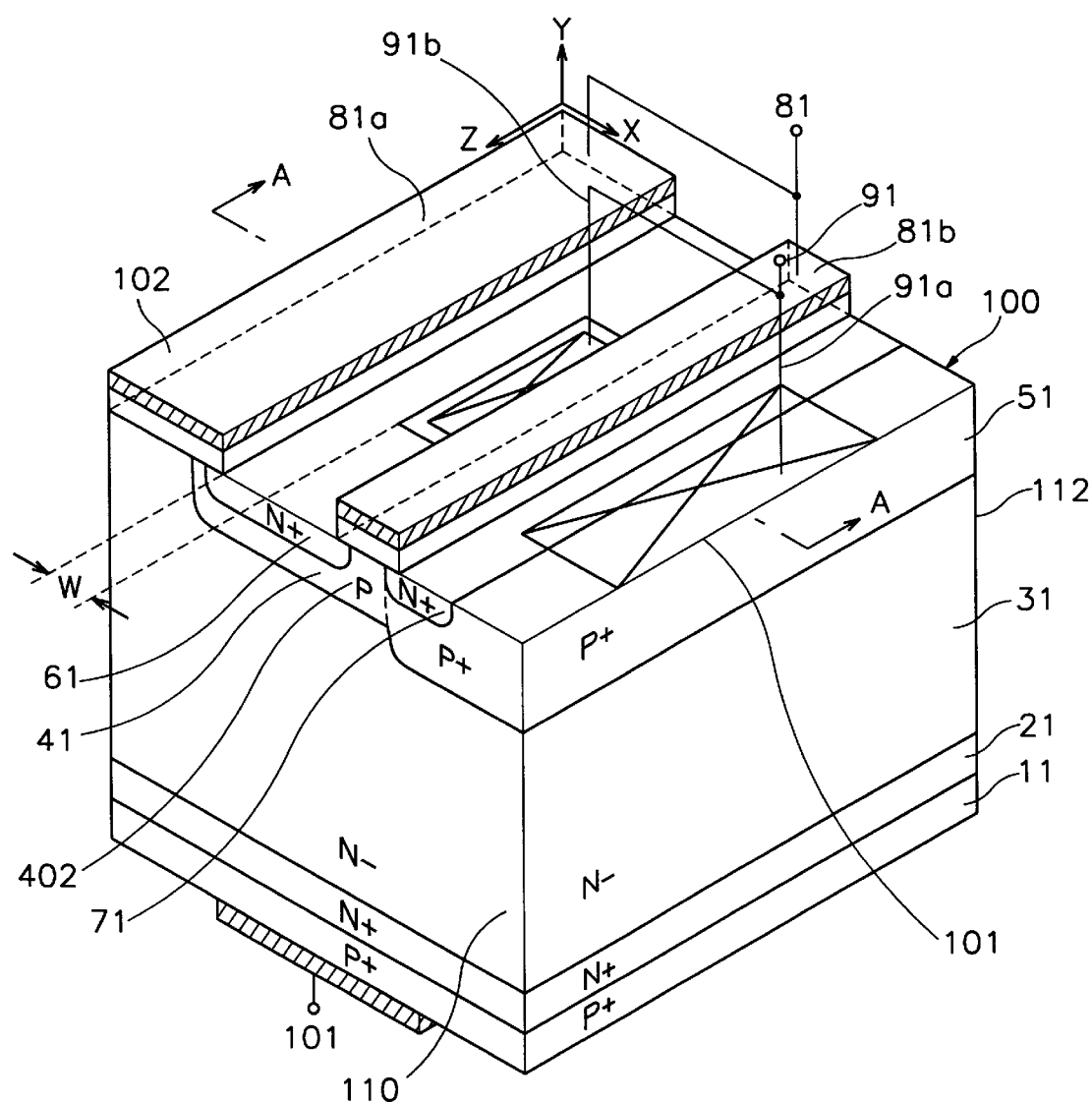
FIG. 6 is a perspective view illustrating an EST according to a preferred embodiment of the present invention.
Figure 8:
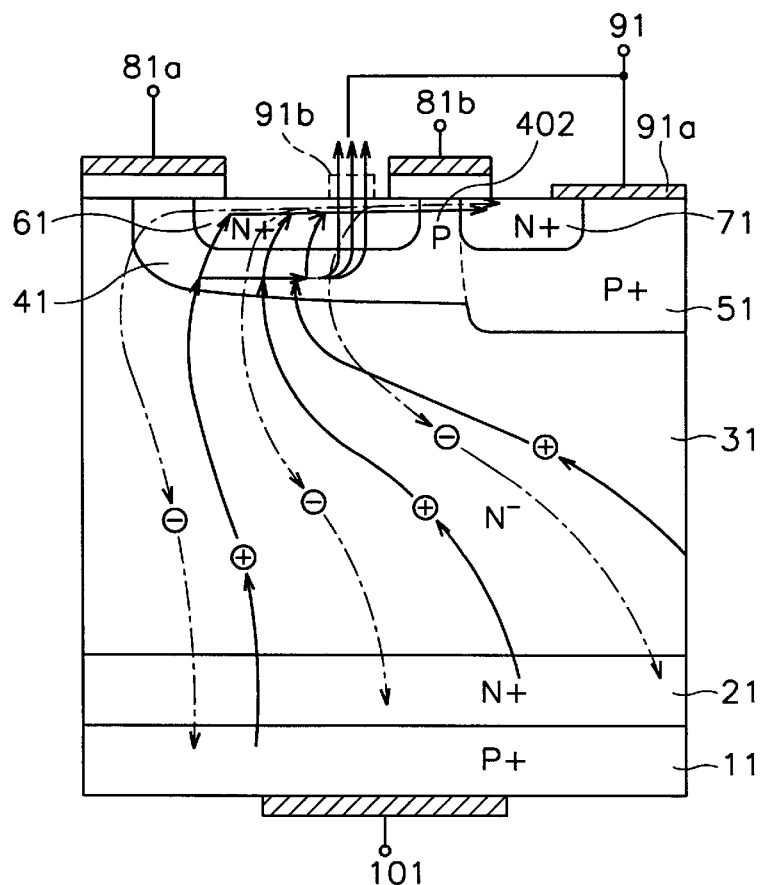
FIG. 8 is a sectional view illustrating the operation of the EST illustrated in FIG. 6.

FIG. 6 is a perspective view illustrating an emitter switch thyristor according to a preferred embodiment of the present invention, sectioned along x, y and z axes. FIG. 7 is a sectional view taken of the EST illustrated in FIG. 6, taken along the line A–A'. FIG. 8 (a side view) and FIG. 9 (a top view) together illustrate the operation of the EST illustrated in FIG. 6.

As shown in FIG. 6, a semiconductor substrate of a first conductivity type (e.g., a p-type) is provided. A semiconductor region of a second conductivity type (e.g., an n-type) is formed on the substrate. One or more well regions of the first conductivity type (p-type) are formed within the semiconductor region, and a plurality of well subregions of the second conductivity type (n-type) are formed within the one or more well regions. The well subregions are separated by a separating portion of the well region.

Electrode contacts are provided, including a gate electrode in contact with the well region and at least first and second cathode electrodes. The first cathode electrode is in contact with one of the well subregions, and the second cathode electrode is in contact with the separating portion of the well region.

More specifically, the semiconductor substrate may comprise a high-concentration P+ substrate 11. The semiconductor region formed on the substrate may comprise a buffer layer 21 and an epitaxial layer 31. Buffer layer 21 may comprise a high-concentration N+ layer formed directly on substrate 11. Epitaxial layer 31 may comprise a low-concentration N– layer formed directly on buffer layer 21. The well region which is formed within the semiconductor region (comprising buffer layer 21 and epitaxial layer 31) may comprise one or more active wells. In the specifically illustrated embodiment, the well region comprises a low-concentration P type well subregion 41 and a high-concentration P+ type active well subregion 51. Each of substrate 11, buffer layer 21 and epitaxial layer 31 is in a plane substantially parallel to an x–z plane (referring to the x–y–z coordinates shown in FIG. 6).

Low-concentration active well 41 and high-concentration active well 51 are in direct contact with each other and are formed within epitaxial layer 31. They are positioned at a top surface of the combined semiconductor device 100. Low-concentration active well 41 and high-concentration well 51 are longitudinal in shape and are each substantially parallel with the z axis. Together they occupy an upper right corner region, at a top surface 104 of the semiconductor device 100 and at an upper right corner edge 101 of semiconductor device 100, but spaced from an upper left corner edge 102.

Referring to the sectional side view shown in FIG. 7, low-concentration active well 41 is provided at a middle location at a top surface 104 of semiconductor device 100. A left side of low-concentration active well 41 is spaced from a left side 106 of semiconductor device 100, and a right side of low-concentration active well 41 is in direct contact with a left side of high-concentration active well 51. The right side of high-concentration active well 51 forms part of right side 108 of semiconductor device 100.

Referring to FIG. 6, floating emitter region 61 is formed within low-concentration active well 41 and is longitudinal in shape. It extends substantially parallel to the z axis from a front 110 to a back 112 of semiconductor device 100. The top surface of floating emitter region 61 forms part of top surface 104 of semiconductor device 100, and the bottom and side surfaces of floating emitter region 61 are in direct contact with portions of low-concentration active well 41.

Main emitter region 71 is formed within high-concentration active well 51 and is longitudinal in shape. It similarly extends from a front 110 to a back 112 of semiconductor device 100, and is substantially parallel to the z axis. Its top surface forms part of top surface 104 of semiconductor device 100. The left side surface of main emitter region 71 coincides with the point at which low-concentration active well 41 and high-concentration active well 51 come into contact with each other. Its lower surface and right side surface are in direct contact with high-concentration active well 51.

A plurality of electrodes are provided on top surface 104 of semiconductor device 100, including a turn-on gate 81a, another gate 81b, a first cathode 91a, and a second cathode 91b. Turn-on gate 81a and other gate 81b are each electrically connected to a gate electrode 81.

Turn-on gate 81a extends from front 110 to back 112 of semiconductor device 100 along the z axis, and electronically contacts epitaxial layer 31 (at an upper left portion thereof), low-concentration active well 41 (at an upper left portion thereof), and floating emitter region 61 (at an upper left portion thereof). Other gate 81b extends from front 110 to back 112 of semiconductor device 100 along the z axis.

It comes into contact with an upper right surface portion of low-concentration active well 41 and an upper left top surface portion of main emitter region 71.

First cathode 91a is formed at right-side position on top surface 104 of semiconductor device 100. More specifically, it extends from a first position near front 110 to a second position near back 112 of semiconductor device 100. It comes in contact with a right top surface portion of main emitter region 71 and with a top surface portion of high-concentration active well 51.

Second cathode 91b is formed at an intermediate position on top surface 104 of semiconductor device 100. It extends from a first position near front 110 to a second position near back 112 of semiconductor device 100. It is positioned near (but not in contact with) the confines of floating emitter region 61 at a position corresponding to the part of floating emitter region 61 which has a reduced width W. Second cathode 91b is in direct contact with a central indented top surface portion 400 (see FIG. 9) of active well 41.

Low-concentration active well 41 and high-concentration active well 51 (having a conjunction deeper than that of low-concentration active well 41) may each be formed by diffusing impurities into epitaxial layer 3. The depth of each of these active wells is preferably about 3~10 $\mu$m (i.e., between approximately 3 and 10 $\mu$m). Floating emitter region 61 may similarly be formed within low-concentration active well 41 by diffusion, and main emitter region 71 may be formed within high-concentration active well 51. Main emitter region 71 is separated from floating emitter region 61 by a separating portion 402 of the overall well region (formed by low-concentration active well 41 together with high-concentration active well 51).

An anode 101 is formed on a lower surface of semiconductor device 100. More specifically, anode 101 is formed on a lower surface of semiconductor substrate 11.

Figure 1:
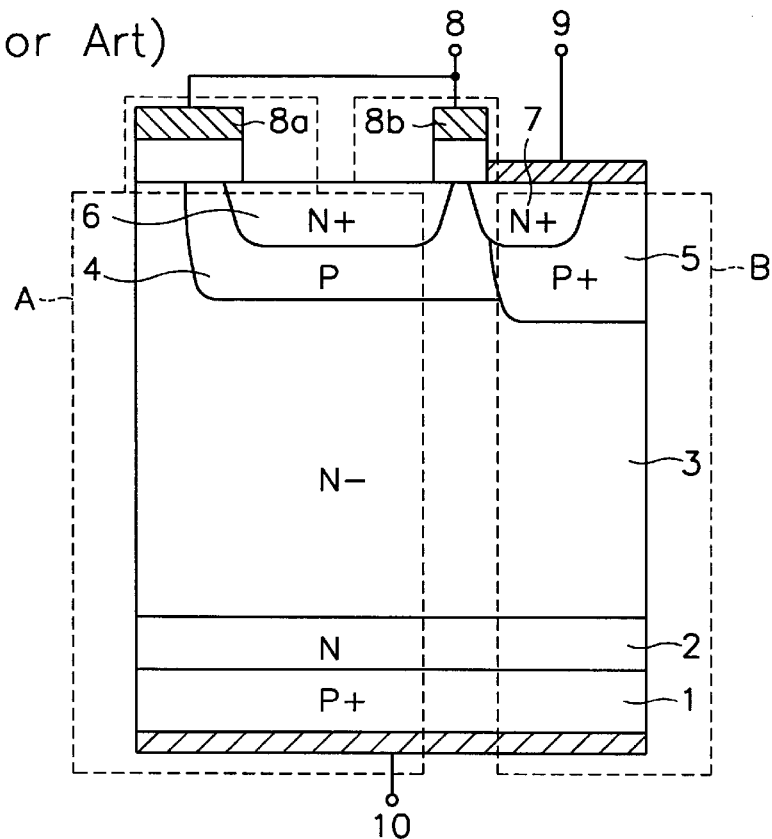
FIG. 1 is a sectional view illustrating the structure of a conventional EST.
Figure 2:
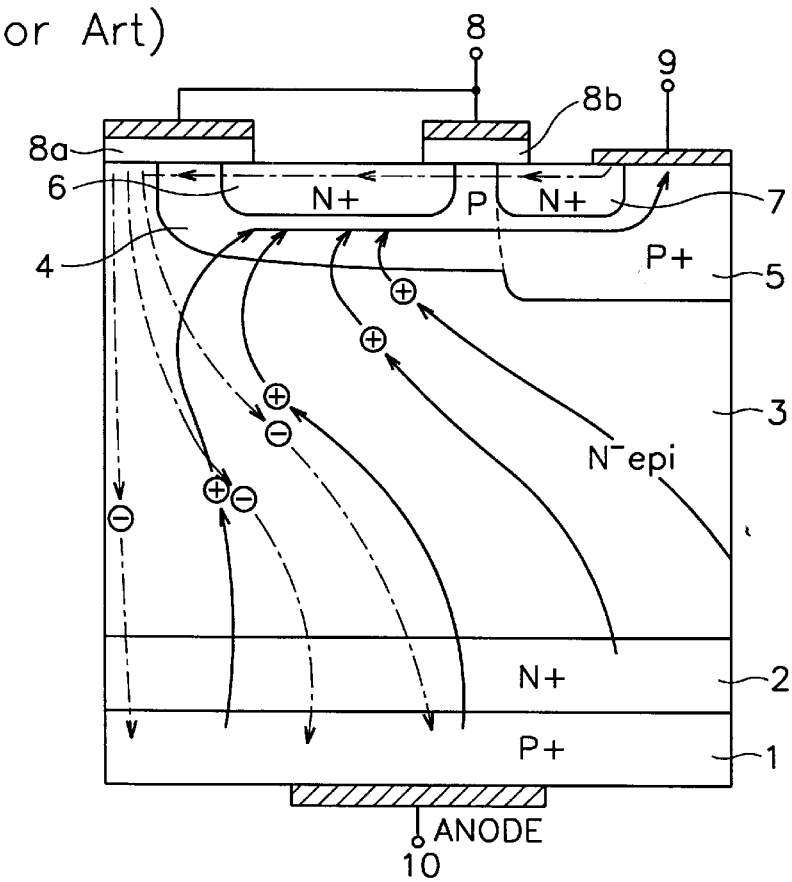
FIGS. 2–4 are sectional views illustrating the operation of the EST illustrated in FIG. 1.
Figure 3:
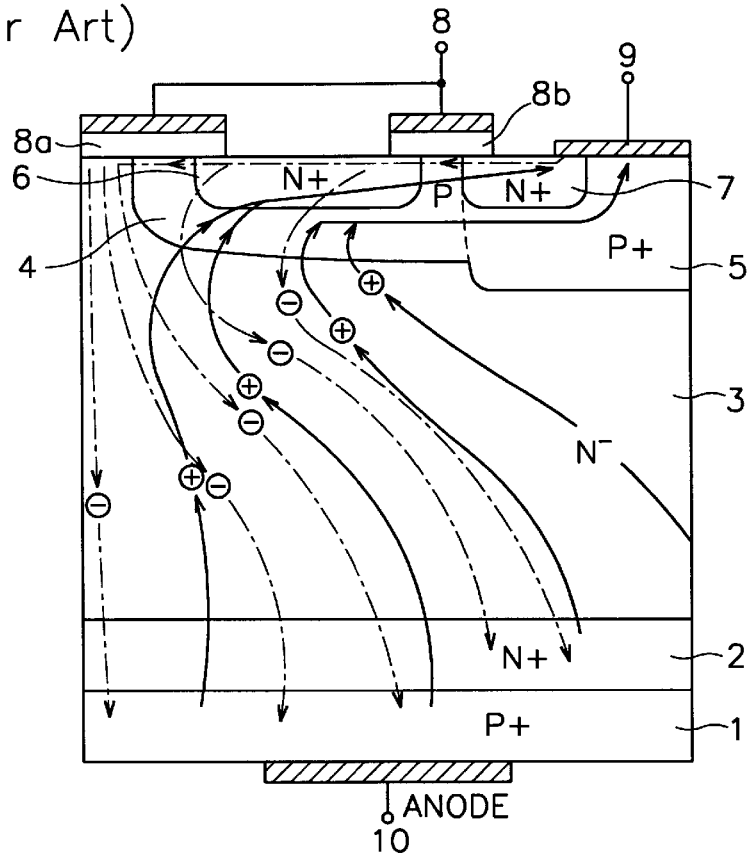
Figure 4:
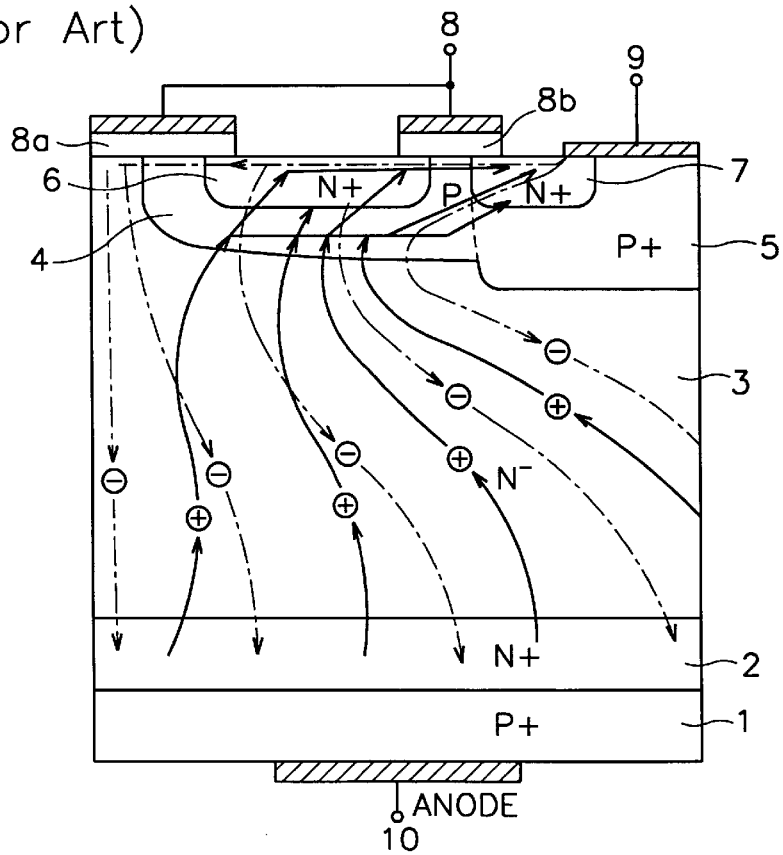
Figure 5:
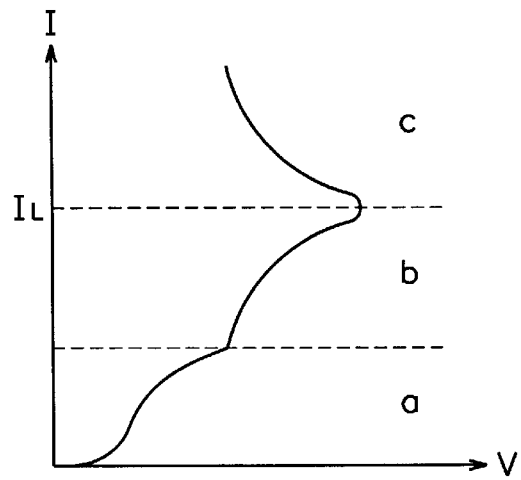
FIG. 5 is a graph illustrating the current-voltage characteristics of the EST illustrated in FIG. 1.
Figure 9:
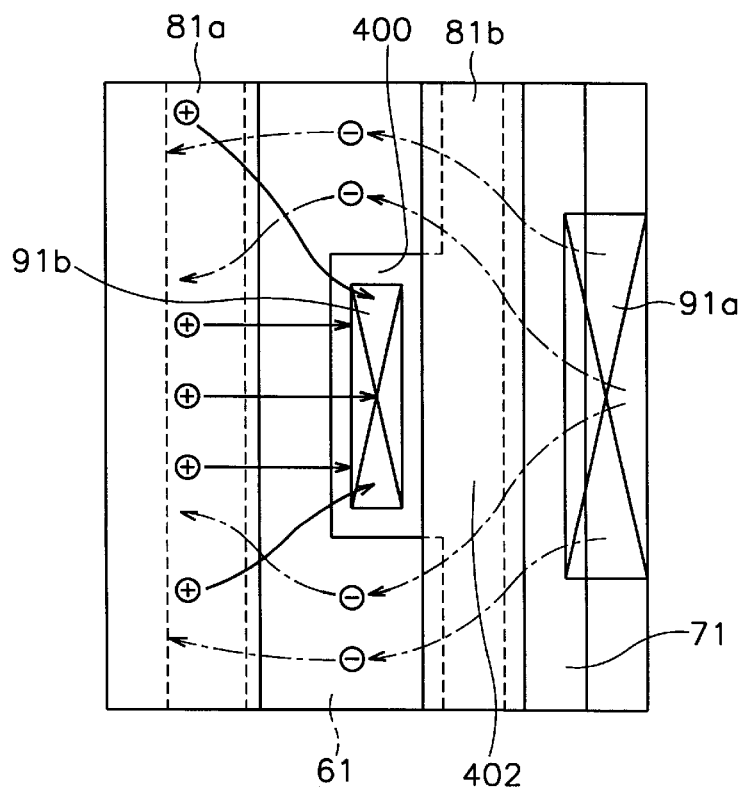
FIG. 9 is a top view of the EST, further demonstrating the operation of the same.

FIGS. 8 and 9 show the flow of the electrons and the flow of holes in the semiconductor device 100 illustrated in FIG. 6. When a positive bias voltage is applied between anode 101 and cathode 91 (which connects first cathode 91a to second cathode 91b), and a positive bias voltage beyond a certain threshold voltage value is applied to gates 81a and 81b (which are connected with a gate electrode), an inversion layer is formed just below gates 81a, 81b inside of active wells 41, 51, allowing the illustrated EST to be turned on. A transistor structure composed of a floating emitter region 61, a low-concentration well 41, and epitaxial layer 31, facilitates the triggering (turning on) of the EST in a method similar to that described above with respect to the conventional EST shown in FIG. 1.

If the bias voltage applied between anode 101 and cathode 91 is increased, the current level (of the current entering anode 101) is also increased. The hole current flowing within low-concentration active well 41 is also increased. A voltage drop caused by this increase in hole current causes part of that hole current to flow to main emitter region 71 via the inside of floating emitter region 61, while remaining portions of that hole current flows into nearby second cathode 91b.

Since this hole current flows into nearby second cathode 91b, it delays the activation of the parasitic thyristor (which corresponds to the PNPN device formed by substrate 11, buffer layer 21, epitaxial layer 31, high-concentration active well 51 and main emitter region 71). Accordingly, the illustrated embodiment EST has a delayed latch-up phenomenon, and effectively has a higher latching current value thereby increasing the operating range of the EST (i.e., the range of the current voltage and voltage values ($V_{AC}$ and $I_A$)) which can be achieved without latching the EST (i.e., by causing the current entering anode 101 ($I_A$) to exceed the latch current ($I_L$)).

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art with which the invention pertains.

The present disclosure is related to Korean Patent Application No. 95-37098, filed on Oct. 25, 1995, the content of which is hereby expressly incorporated herein by reference in its entirety.

What is claimed is:

1. An emitter switched thyristor comprising:
    a semiconductor substrate of a first conductivity type;
    a semiconductor region of a second conductivity type area formed on said substrate;
    a well region of said first conductivity type formed within said semiconductor region;
    a plurality of well subregions of said second conductivity type formed within said well region and separated by a separating portion of said well region; and
    a plurality of electrode contacts comprising a gate electrode in contact with said well region and at least first and second cathode electrodes, said first cathode electrode being in contact with one of said well subregions and said second cathode electrode being in contact with said separating portion of said well region between said plurality of well subregions.

2. The emitter switched thyristor according to claim 1, wherein said first conductivity type is a p-type and said second conductivity type is an n-type.

3. The emitter switched thyristor according to claim 1, wherein said well region is approximately between 3 and 10 $\mu$m deep.

4. The emitter switched thyristor according to claim 1, further comprising an anode electrode formed on said semiconductor substrate.

5. The emitter switched thyristor according to claim 1, wherein an impurity density distribution of said semiconductor region is not uniform.

6. The emitter switched thyristor according to claim 1, wherein a lower part of said semiconductor region is doped with a high impurity concentration and an upper part of said semiconductor region is doped with a low impurity concentration.

7. An emitter switched thyristor comprising:
    a semiconductor substrate of a first conductivity type;
    a semiconductor region of a second conductivity type area formed on said substrate;
    a well region of said first conductivity type formed within said semiconductor region;
    a plurality of well subregions of said second conductivity type formed within said well region and separated by a separating portion of said well region; and
    a plurality of electrode contacts comprising a gate electrode in contact with said well region and at least first and second cathode electrodes, said first cathode electrode being in contact with one of said well subregions and said second cathode electrode being in contact with said separating portion of said well region; and wherein said well region comprises an impurity density distribution which is not uniform.

8. The emitter switched thyristor according to claim 7, wherein said well region comprises a first region having a low impurity concentration and a second region having a high impurity concentration, at least one of said plurality of well subregions being formed in each of said first region and said second region.

9. The emitter switched thyristor according to claim 8, wherein said second cathode electrode is in contact with said first region of said well region.

10. The emitter switched thyristor according to claim 9, wherein said first cathode electrode is in contact with said second region of said well region.

11. The emitter switched thyristor according to claim 8, wherein said second region is deeper than said first region.

12. The emitter switched thyristor according to claim 7, wherein said first conductivity type is a p-type and said second conductivity type is an n-type.

13. The emitter switched thyristor according to claim 7, wherein said well region is approximately between 3 and 10 $\mu$m deep.

14. The emitter switched thyristor according to claim 7, further comprising an anode electrode formed on said semiconductor substrate.

15. The emitter switched thyristor according to claim 7, wherein an impurity density distribution of said semiconductor region is not uniform.

16. The emitter switched thyristor according to claim 7, wherein a lower part of said semiconductor region is doped with a high impurity concentration and an upper part of said semiconductor region is doped with a low impurity concentration.

17. An emitter switched thyristor comprising:

a semiconductor substrate of a first conductivity type;

a semiconductor region of a second conductivity type area formed on said substrate;

a well region of said first conductivity type formed within said semiconductor region;

a plurality of well subregions of said second conductivity type formed within said well region and separated by a separating portion of said well region; and a plurality of electrode contacts comprising a gate electrode in contact with said well region and at least first and second cathode electrodes, said first cathode electrode being in contact with the top of one of said well subregions and said second cathode electrode being in contact with the top of said separating portion of said well region.

18. The emitter switched thyristor according to claim 17, wherein said first conductivity type is a p-type and said second conductivity type is an n-type.

19. The emitter switched thyristor according to claim 17, wherein said well region is approximately between 3 and 10 $\mu$m deep.

20. The emitter switched thyristor according to claim 17, wherein said well region comprises an impurity density distribution which is not uniform.

21. The emitter switched thyristor according to claim 20, wherein said well region comprises a first region having a low impurity concentration and a second region having a high impurity concentration, at least one of said plurality of well subregions being formed in each of said first region and said second region.

22. The emitter switched thyristor according to claim 21, wherein said second cathode electrode is in contact with the top of said first region of said well region.

23. The emitter switched thyristor according to claim 22, wherein said first cathode electrode is in contact with the top of said second region of said well region.

24. The emitter switched thyristor according to claim 21, wherein said second region is deeper than said first region.

25. The emitter switched thyristor according to claim 17, further comprising an anode electrode formed on said semiconductor substrate.

26. The emitter switched thyristor according to claim 17, wherein an impurity density distribution of said semiconductor region is not uniform.

27. The emitter switched thyristor according to claim 17, wherein a lower part of said semiconductor region is doped with a high impurity concentration and an upper part of said semiconductor region is doped with a low impurity concentration.

* * * * *